(12) United States Patent
Miyamoto

(10) Patent No.: US 12,429,770 B2
(45) Date of Patent: Sep. 30, 2025

(54) LITHOGRAPHIC PRINTING PLATE PRECURSOR AND METHOD OF USE

(71) Applicant: Eastman Kodak Company, Rochester, NY (US)

(72) Inventor: Yasushi Miyamoto, Tatebayashi (JP)

( * ) Notice: Subject to any disclaimer, the term of this patent is extended or adjusted under 35 U.S.C. 154(b) by 182 days.

(21) Appl. No.: 18/341,955

(22) Filed: Jun. 27, 2023

(65) Prior Publication Data

US 2025/0013151 A1 Jan. 9, 2025

(51) Int. Cl.
| | |
|---|---|
| *G03F 7/035* | (2006.01) |
| *B41C 1/10* | (2006.01) |
| *G03F 7/30* | (2006.01) |
| *G03F 7/32* | (2006.01) |

(52) U.S. Cl.
CPC ........... *G03F 7/035* (2013.01); *B41C 1/1008* (2013.01); *G03F 7/322* (2013.01); *B41C 2210/04* (2013.01); *B41C 2210/06* (2013.01); *G03F 7/3035* (2013.01)

(58) Field of Classification Search
CPC ....................................................... G03F 7/32
See application file for complete search history.

(56) References Cited

U.S. PATENT DOCUMENTS

| | | | |
|---|---|---|---|
| 5,837,422 A | 11/1998 | Sasaki et al. | |
| 6,309,792 B1 | 10/2001 | Hauck et al. | |
| 6,569,603 B2 | 5/2003 | Furukawa | |
| 6,893,797 B2 | 5/2005 | Munnelly et al. | |
| 6,902,866 B1 | 6/2005 | Teng | |
| 7,063,936 B2 | 6/2006 | Kakino et al. | |
| 7,682,776 B2 | 3/2010 | Teng | |
| 2007/0172766 A1* | 7/2007 | Teng | G03F 7/38 |
| | | | 430/302 |
| 2008/0038668 A1* | 2/2008 | Teng | G03F 7/027 |
| | | | 430/302 |
| 2009/0004595 A1* | 1/2009 | Munnelly | B41C 1/1008 |
| | | | 430/270.1 |
| 2022/0072844 A1 | 3/2022 | Miyamoto et al. | |
| 2022/0118754 A1 | 4/2022 | Merka et al. | |
| 2022/0194112 A1 | 6/2022 | Obenauf et al. | |

FOREIGN PATENT DOCUMENTS

| | | | | |
|---|---|---|---|---|
| EP | 1 182 033 | | 11/2006 | |
| WO | WO-2018128830 A1 | * | 7/2018 | ........... B41C 1/1008 |

OTHER PUBLICATIONS

Dzunuzovic et al. J. Serb. Chem. Soc. 69 (6) 441-453 (Year: 2004).*

* cited by examiner

*Primary Examiner* — Chanceity N Robinson
(74) *Attorney, Agent, or Firm* — J. Lanny Tucker

(57) ABSTRACT

A negative-working lithographic printing plate precursor has a negative-working infrared radiation-sensitive image-recording layer that has a) two or more free radically polymerizable components; b) an initiator composition capable of generating free radicals; and c) one or more infrared radiation absorbing cyanine dyes. The a) two or more free radically polymerizable components comprise a combination of a urethane (meth)acrylate and a polyester (meth)acrylate, which together, comprise 75-100 weight % of all free radically polymerizable components. The weight ratio of the urethane (meth)acrylates to the polyester (meth)acrylates is from 90:10 to and including 35:65. The urethane (meth)acrylates comprise one or more urethane linkages and at least 4 acrylate or methacrylate ester groups. Each of the one or more polyester (meth)acrylates is free of a urethane linkage and is represented following structure (I). These precursors are less sensitive to ambient ozone and can be infrared radiation imaged and developed on-press during lithographic printing.

20 Claims, No Drawings

LITHOGRAPHIC PRINTING PLATE PRECURSOR AND METHOD OF USE

FIELD OF THE INVENTION

This invention relates to infrared radiation-sensitive lithographic printing plate precursors that can be imaged using infrared radiation to provide imaged lithographic printing plates. Such precursors include a critical combination of free radically polymerizable components to provide protection of infrared absorbing cyanine dyes from ambient ozone and thereby minimize loss of on-press developability and printing durability. The inventive precursors are negative-working and particularly on-press developable. This invention also relates to methods of using these precursors to provide lithographic printing plates after appropriate infrared radiation imaging and development, especially after on-press development.

BACKGROUND OF THE INVENTION

Imaging systems, such as computer-to-plate (CTP) imaging systems are known in the art and are used to record an image on a lithographic printing plate precursor. Such precursors comprise a substrate typically composed of aluminum that has a hydrophilic surface on which one or more radiation-sensitive imageable layers are disposed. These precursors are used to make lithographic printing plates having lithographic ink receptive regions, known as image areas, on the hydrophilic surface of the substrate. When the printing plate surface is moistened with water and a lithographic printing ink is applied, hydrophilic regions retain the water and repel the lithographic printing ink, and the lithographic ink receptive image regions accept the lithographic printing ink and repel the water. The lithographic printing ink is transferred to the surface of a material upon which the image is to be reproduced, perhaps with the use of a blanket roller.

Lithographic printing plate precursors are considered either "positive-working" or "negative-working." Positive-working lithographic printing plates precursors are designed with one or more radiation-sensitive layers such that upon imagewise exposure to suitable radiation such as infrared radiation, the exposed regions of the layers become more alkaline solution soluble and can be removed during processing to leave the non-exposed regions that accept lithographic ink for printing.

In contrast, negative-working lithographic printing plate precursors are designed with a radiation-sensitive layer such that upon imagewise exposure to suitable radiation such as infrared radiation, the exposed regions of the layer are hardened and become resistant to removal during processing, while the non-exposed regions are removable during processing.

In the current state of the art in the lithographic printing industry, lithographic printing plate precursors are usually imagewise exposed to imaging radiation such as infrared radiation using lasers in an imaging device commonly known as a platesetter (for CTP imaging) before additional processing (development) to remove unwanted materials from the imaged precursors.

In recent years, there has been an increased desire in the lithographic printing industry for simplification in making lithographic printing plates by carrying out development on-press ("DOP") using a lithographic printing ink or fountain solution, or both, to remove non-exposed regions of the image-recording layer. Thus, use of on-press developable lithographic printing plate precursors is being adopted more and more in the printing industry due to many benefits, including less environmental impact and savings on processing chemicals, processor floor space, and operation and maintenance costs. After laser imaging, on-press developable precursors can be taken directly to lithographic printing presses.

Many of these positive-working and negative-working lithographic printing precursors used in the industry are designed to be sensitive to near-infrared or infrared radiation (typically radiation having a radiation of at least 800 nm). It has become particularly desirable to design negative-working precursors such as those that are developable on-press to contain cyanine dye compounds, particularly those containing polymethine chains, as infrared radiation-sensitive dyes.

However, it has been found that many of such cyanine infrared radiation-sensitive dyes are particularly vulnerable to attack by ambient ozone, especially when such compounds are incorporated into uppermost layer(s) of the precursors. Such attack can result in the precursors losing their on-press durability. These problems can be particularly acute when the precursors are stored for a lengthy time before they are exposed, processed (developed), and used for lithographic printing.

U.S. Patent Application Publication 2019/0022993 (Igarashi et al.) describes the use of specifically placed filters in or around an imaging apparatus (such as a platesetter) to remove ambient ozone and thus to reduce the impact of ozone on negative-working lithographic printing plate precursors.

U.S. Patent Application Publication 2022/0072844 (Miyamoto et al., hereinafter U.S. '844) describes an advance in the art for improving the stability of negative-working lithographic printing plate precursors by including a defined ozone-blocking material in such precursor.

Having discovered the problems caused by ambient ozone, and after extensive investigations to try various solutions to the problems, it was discovered that further improvements than those described in U.S. '844 are desirable.

SUMMARY OF THE INVENTION

The present invention provides a negative-working lithographic printing plate precursor comprising an aluminum-containing substrate, and a negative-working infrared radiation-sensitive image-recording layer disposed on the aluminum-containing substrate, the negative-working infrared radiation-sensitive image-recording layer comprising:
a) two or more free radically polymerizable components;
b) an initiator composition capable of generating free radicals; and
c) one or more infrared radiation absorbing cyanine dyes,
wherein the a) two or more free radically polymerizable components comprise one or more urethane (meth)acrylates and one or more polyester (meth)acrylates, which together, comprise at least 75 weight % and up to and including 100 weight % of all free radically polymerizable components,
wherein the weight ratio of the one or more urethane (meth)acrylates to the one or more polyester (meth) acrylates is from 90:10 to and including 35:65,
wherein each of the one or more urethane (meth)acrylates comprises one or more urethane linkages and at least 4 acrylate or methacrylate ester groups, and wherein each of the one or more polyester (meth)acrylates is free of a urethane linkage and is represented by the following structure (I):

X—OC(=O)-L-C(=O)—O—Y  (I)

wherein L represents a single bond or a carbon chain, X and Y represent independently a hydrogen atom or an organic group that is represented by Structure (II) below, with the proviso that X and Y cannot both be hydrogen atoms,

-A(R)$_n$  (II)

wherein A represents an n+1 valent organic group; R represents a hydroxy group, an acrylate ester group (CH$_2$=CHC(=O)O—), or a methacrylate ester group (CH$_2$=C(CH$_3$)C(=O)O—); and n is an integer equal to or greater than 1 but less than 12, with the proviso that not all R groups are hydroxy groups.

In some embodiments of the present invention, a negative-working lithographic printing plate precursor comprises an aluminum-containing substrate comprising two or more aluminum oxide layers, and a negative-working infrared radiation-sensitive image-recording layer disposed as the outermost layer on the aluminum-containing substrate, the negative-working infrared radiation-sensitive image-recording layer comprising:
a) two or more free radically polymerizable components;
b) an initiator composition capable of generating free radicals and comprising an iodonium cation and a tetraaryl borate anion; and
c) one or more infrared radiation absorbing cyanine dyes,
wherein the a) two or more free radically polymerizable components comprise one or more urethane (meth)acrylates and one or more polyester (meth)acrylates, which together, comprise at least 80 weight % and up to and including 100 weight % of all free radically polymerizable components,
wherein the weight ratio of the one or more urethane (meth)acrylates to the one or more polyester (meth)acrylates is from 75:25 to and including 50:50,
wherein each of the one or more urethane (meth)acrylates comprises one or more urethane linkages and at least 4 acrylate or methacrylate ester groups and is represented by the following structure (III):

L'-[NH—C(=O)—O—X']$_p$  (III)

wherein L' represents a p-valent linking group, p is an integer of 2 or 3, and X' is represented by the following structure (IV):

-A'(R')$_{n'}$  (IV)

wherein A' represents an n'+1 valent organic group, R' independently represents a hydroxy group, an acrylate ester group [CH$_2$=CHC(=O)O—], or a methacrylate ester group [(CH$_2$=C(CH$_3$)C(=O)O—], and n' is an integer equal to or greater than 1 but less than 6, with the proviso that not all R' groups are hydroxy groups, and wherein each of the one or more polyester (meth)acrylates is free of a urethane linkage and is represented by the following structure (I):

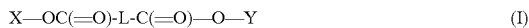

X—OC(=O)-L-C(=O)—O—Y  (I)

wherein L represents a single bond or is selected from a *CH$_2$—CH$_2$* group, a *CH=CH* group, and either of groups Ia and Ib shown as follows:

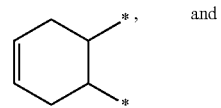

(Ia)

and

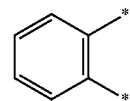

(Ib)

wherein * represents the connecting points to the rest of Structure (I), and X and Y represent independently a hydrogen atom or an organic group that is represented by structure (II) below, with the proviso that X and Y cannot both be hydrogen atoms,

-A(R)$_n$  (II)

wherein A represents an n+1 valent organic group, R represents a hydroxy group, an acrylate ester group (CH$_2$=CHC(=O)O—), or a methacrylate ester group (CH$_2$=C(CH$_2$)C(=O)O—), and n is an integer equal to or greater than 1 but less than 12, with the proviso that not all R groups are hydroxy groups.

In addition, the present invention provides a method for providing a lithographic printing plate, comprising:
A) imagewise exposing the negative-working lithographic printing plate precursor according to any embodiment of the present invention to imaging infrared radiation, to provide exposed regions and non-exposed regions in the negative-working infrared radiation-sensitive image-recording layer, and
B) removing the non-exposed regions in the negative-working radiation-sensitive image-recording layer from the aluminum-containing substrate.

The present invention overcomes the noted reduced imaging sensitivity and on-press printing durability problems caused by ambient ozone by the selection of a critical combination of a) two or more free radically polymerizable components in a critical amount and weight ratio into the negative-working infrared radiation-sensitive image-recording layer. This selection in the negative-working infrared radiation-sensitive image-recording layer unexpectedly provides excellent resistance of the infrared radiation absorbing cyanine dyes against degradation in the presence of ambient ozone, and thus allowing the printing press operator to keep desired imaging speed (imaging sensitivity) and other properties of the lithographic printing plate precursors such as on-press printing durability of the resulting lithographic printing plates.

In particular, the noted problems were solved by selecting a combination of one or more urethane (meth)acrylates and one or more polyester (meth)acrylates as at least 75 weight % of all of the free radically polymerizable components in the negative-working infrared-sensitive image-recording layer. The critical presence of the urethane (meth)acrylate improves printing durability (press life as defined below) with or without exposure to ambient ozone, but their presence also tends to reduce on-press developability (DOP as defined below). By incorporating specific amounts of a polyester (meth)acrylate in combination with the urethane (meth)acrylate, the on-press developability is improved while unexpectedly maintaining desired printing durability (press life) and other properties even after exposure to ambient ozone. While other non-urethane (meth)acrylates are known to improve on-press developability, they tend to make infrared absorbing cyanine dyes vulnerable to degradation and thus the printing durability and other properties can deterorate when the non-imaged precursor is exposed to ambient ozone.

DETAILED DESCRIPTION OF THE INVENTION

The following discussion is directed to various embodiments of the present invention and while some embodiments can be desirable for specific uses, the disclosed embodiments should not be interpreted or otherwise considered to limit the scope of the present invention, as claimed below. In addition, one skilled in the art will understand that the following disclosure has broader application than is explicitly described in the discussion of any specific embodiment.

Definitions

As used herein to define various components of the infrared radiation-sensitive image-recording layer, and other layers or materials used in the practice of this invention, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term should be interpreted to have a standard dictionary meaning.

The use of numerical values in the various ranges specified herein, unless otherwise expressly indicated, are to be considered as approximations as though the minimum and maximum values within the stated ranges were both preceded by the word "about." In this manner, slight variations above and below the stated ranges may be useful to achieve substantially the same results as the values within the ranges. In addition, the disclosure of these ranges is intended as a continuous range including every value between the minimum and maximum values as well as the end points of the ranges.

Unless the context indicates otherwise, when used herein, the terms "negative-working lithographic printing plate precursor," "precursor," and "IR-sensitive negative-working lithographic printing plate precursor" are meant to be equivalent references to embodiments of the present invention.

As used herein, the term "infrared radiation absorbing cyanine dye" refers to a cyanine dye compound or material that absorbs electromagnetic radiation in the near-infrared (near-IR) and infrared (IR) regions of the electromagnetic spectrum, and it typically refers to cyanine dye compounds or materials that have an absorption maximum in the near-IR and IR regions.

As used herein, the terms "near-infrared region" and "infrared region" refer to radiation having a wavelength of at least 750 nm and higher. In most instances, the terms are used to refer to the region of the electromagnetic spectrum of at least 750 nm and more likely of at least 800 nm and up to and including 1400 nm.

For clarification of definitions for any terms relating to polymers, reference should be made to "Glossary of Basic Terms in Polymer Science" as published by the International Union of Pure and Applied Chemistry ("IUPAC"), Pure Appl. Chem. 68, 2287-2311 (1996). However, any definitions explicitly set forth herein should be regarded as controlling.

As used herein, the term "polymer" is used to describe compounds with relatively large molecular weights formed by linking together many small reactive monomers to form recurring units of the same chemical composition. These polymer chains usually form coiled structures in a random fashion. With the choice of solvents, a polymer can become insoluble as the chain length grows and become polymeric particles dispersed in the solvent medium. These particle dispersions can be very stable and useful in infrared radiation-sensitive imageable layers described for use in the present invention. In this invention, unless indicated otherwise, the term "polymer" refers to a non-crosslinked material. Thus, crosslinked polymeric particles differ from the non-crosslinked polymeric particles in that the latter can be dissolved in certain organic solvents of good solvating property whereas the crosslinked polymeric particles may swell but do not dissolve in the organic solvent because the polymer chains are connected by strong covalent bonds.

The term "copolymer" refers to polymers composed of two or more different repeating or recurring units that are arranged along the polymer chain.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers.

As used herein, the term "ethylenically unsaturated polymerizable monomer" refers to a compound comprising one or more ethylenically unsaturated (—C═C—) bonds that are polymerizable using free radical or acid-catalyzed polymerization reactions and conditions. It is not meant to refer to chemical compounds that have only unsaturated —C═C— bonds that are not polymerizable under these conditions.

Unless otherwise indicated, the term "weight %" refers to the amount of a component or material based on the total solids of a composition, formulation, or layer. Unless otherwise indicated, the percentages can be the same for either a dry layer or the total solids of the formulation or composition.

As used herein, the term "layer" or "coating" can consist of one disposed or applied layer or a combination of several sequentially disposed or applied layers. If a layer is considered infrared radiation-sensitive and negative-working, it is both sensitive to infrared radiation (as described above for "infrared radiation-absorber") and negative-working in the formation of lithographic printing plates.

Uses

The lithographic printing plate precursors according to the present invention are useful for providing lithographic printing plates using negative-working imaging chemistry present in one or more negative-working infrared radiation-sensitive image-recording layers. These lithographic printing plates are useful for lithographic printing during press operations. The lithographic printing plates can be prepared according to the present invention using either on-press or off-press processing (development) as described below. The inventive negative-working lithographic printing plate precursors are prepared with the structures and components described as follows.

Lithographic Printing Plate Precursors

The precursors according to the present invention can be formed by suitable application of one or more negative-working infrared radiation-sensitive image-recording compositions as described below to a suitable substrate (as described below) to form one or more negative-working infrared radiation-sensitive image-recording layers thereon. All of these precursors require the presence of a substrate that is described as follows.

Substrate:

The substrate that is used to prepare the precursors according to this invention generally has a hydrophilic imaging-side surface, or at least a surface that is more hydrophilic than the negative-working infrared radiation-sensitive image-recoding layer(s) disposed thereon. The substrate generally comprises an aluminum-containing support that can be composed of raw aluminum or a suitable aluminum alloy that is conventionally used to prepare lithographic printing plate precursors, and thus the more desirable substrates are aluminum-containing substrates that are detailed below.

An aluminum-containing substrate can be treated using techniques known in the art, including subjecting an aluminum-containing support to roughening for example by physical (mechanical) graining, electrochemical graining, or chemical graining, which is followed by one or more anodizing treatments, and including various rinsing operations as appropriate times.

Each anodizing treatment is typically carried out using either phosphoric or sulfuric acid and conventional conditions to form a desired hydrophilic aluminum oxide (or anodic oxide) layer on the aluminum-containing support. A single aluminum oxide (anodic oxide) layer can be present or multiple (two or more) aluminum oxide layers having multiple pores with varying depths and shapes of pore openings can be present. Such processes thus provide one or more anodic oxide layers underneath the one or more negative-working infrared radiation-sensitive image-recording layers. A discussion of such pores and a process for controlling their width is described for example, in U.S. Patent Publications 2013/0052582 (Hayashi), 2014/0326151 (Namba et al.), and 2018/0250925 (Merka et al.), and U.S. Pat. No. 4,566,952 (Sprintschuik et al.), U.S. Pat. No. 8,789,464 (Tagawa et al.), U.S. Pat. No. 8,783,179 (Kurokawa et al.), and U.S. Pat. No. 8,978,555 (Kurokawa et al.), the disclosures of all of which are incorporated herein by reference, as well as in EP 2,353,882 (Tagawa et al.). Teaching about providing two sequential anodizing treatments to provide different aluminum oxide layers in an improved substrate are described for example, in U.S. Patent Application Publication 2018/0250925 (Merka et al.), the disclosure of which is incorporated herein by reference.

An anodized aluminum-containing support can be further treated to seal the anodic oxide pores or to hydrophilize its surface, or both, using known post-anodic treatment processes, such as post-treatments using aqueous solutions of one or more hydrophilic substances or polymers such as poly(vinyl phosphonic acid) (PVPA), vinyl phosphonic acid copolymers, poly[(meth)acrylic acid] or its alkali metal salts, or (meth)acrylic acid copolymers or their alkali metal salts, mixtures of phosphate and fluoride salts, or sodium silicate. The post-treatment process materials can also comprise unsaturated double bonds to enhance adhesion between the treated aluminum oxide surface and the infrared radiation-exposed regions of the overlying negative-working infrared radiation. Such unsaturated double bonds can be provided in low molecular weight materials or they can be present within side chains of hydrophilic polymers. Useful post-treatment processes include dipping the anodized aluminum-containing substrate with rinsing, dipping the aluminum-containing substrate without rinsing, and various coating techniques such as extrusion coating.

In some embodiments, the hydrophilic layer comprises one or more hydrophilic polymers at a dry coverage of at least 0.0002 $g/m^2$ and up to and including 0.1 $g/m^2$ or in an amount of at least 0.005 $g/m^2$ and up to and including 0.08 $g/m^2$. Generally, the hydrophilic layer is disposed directly on the outer aluminum oxide layer so there are no intermediate layers. Since the outer aluminum oxide layer comprises micropores, some of the hydrophilic layer can reside inside such micropores and within micropores below the outer aluminum oxide layer.

Particularly useful examples of such hydrophilic layers for the present invention include those described in U.S. Patent Application Publication 2022-0118754 (Merka et al.), the disclosure of which is incorporated herein by reference.

In some embodiments, the hydrophilic layer further comprises a compound that has one or more ethylenically unsaturated polymerizable groups, one or more —OM groups at least one of which is connected directly to a phosphorus atom, and a molecular weight of less than 2000 Daltons/mole or less than 1500 Daltons/mole, wherein M represents a hydrogen, sodium, potassium, or aluminum atom.

Particularly useful examples of such hydrophilic layers for the present invention include those described in U.S. Patent Application Publication 2022-0194112 (Obenauf et al.), the disclosure of which is incorporated herein by reference.

Negative-Working Lithographic Printing Plate Precursors

Negative-working lithographic printing plate precursors according to the present invention can be constructed using the following components and materials. Typically, each of these precursors has an aluminum-containing substrate (as described above) on which is disposed one or more negative-working infrared radiation-sensitive image-recording layers, each comprising suitable chemistry for negative-working infrared radiation imaging and suitable processing to facilitate removal of non-exposed regions of each negative-working infrared radiation-sensitive image-recording layer. For some negative-working lithographic printing plate precursors, a single negative-working infrared radiation-sensitive image-recording layer is present on the aluminum-containing substrate.

The infrared radiation-sensitive composition (and infrared radiation-sensitive image-recording layer prepared therefrom) according to the present invention is designed to be "negative-working" as that term is known in the lithographic art. In addition, the infrared radiation-sensitive image-recording layer can be designed with a certain combination of components to provide on-press developability to the negative-working lithographic printing plate precursor after exposure, for example to enable development using a fountain solution, a lithographic printing ink, or a combination of a fountain solution and a lithographic printing ink.

Infrared Radiation Image-Recording Layer(s):

The precursors can be formed by suitable application of one or more negative-working infrared radiation-sensitive compositions as described below to a suitable substrate (as described above) to form one or more negative-working infrared radiation-sensitive image-recording layers on that substrate.

In general, at least one negative-working infrared radiation-sensitive image-recording layer comprises: a) two or more free radically polymerizable components as described below; b) an initiator composition (described below) that is capable of providing free radicals upon exposure of the negative-working infrared radiation-sensitive image-recording layer to imaging infrared radiation; and c) one or more infrared radiation absorbers that includes at least one infrared radiation absorbing cyanine dye as described below, as essential components. Optionally, one or more non-free radically polymerizable polymeric materials are present that are different from all of the a) two or more free radically polymerizable components, b) initiator composition, and c) infrared radiation absorbing cyanine dyes. All of these essential and various optional components are described in more detail below. A negative-working infrared radiation-sensitive image-recording layer can be the outermost layer in the precursor.

An essential component of the one or more negative-working infrared radiation-sensitive image-recording layers is a) two or more free radically polymerizable components, two of which are critical in composition and amount to achieve the advantages described herein. Each of the a) two or more free radically polymerizable components comprises one or more free radically polymerizable groups that can be polymerized using free radical initiation during infrared radiation exposure, and in many embodiments, each of these compounds comprises at least 1 acrylate or methacrylate ester group, or even at least 2 or at least 4 acrylate or methacrylate ester groups.

At least one of the essential compounds of the a) two or more free radically polymerizable components must be a urethane (meth)acrylate, meaning it can be a urethane acrylate or urethane methacrylate compound, or both types of compounds can be present. Each urethane (meth)acrylate comprises one or more urethane [—NHC(=O)O—] groups, or even two or more of these urethane groups, and one or more acrylate or methacrylate groups. Each urethane (meth)acrylate is generally derived by reacting an isocyanate compound having one or more isocyanate (—NCO) groups with an acrylate or methacrylate ester having one or more hydroxy (—OH) groups. For example, one useful urethane (meth)acrylate is derived from reacting hexamethylene diisocyanate with dipentaerythritol pentaacrylate, for example by reacting DESMODUR® N100 aliphatic polyisocyanate resin based on hexamethylene diisocyanate (Bayer Corp., Milford, Conn.) with hydroxyethyl acrylate and pentaerythritol triacrylate. For example, at least one of the one or more urethane (meth)acrylates comprises at least 5 acrylate or methacrylate groups, or even at least 10 acrylate or methacrylate groups.

In some embodiments the one or more urethane (meth) acrylates are represented by the following structure (III):

L'-[NH—C(=O)—O—X']$_p$    (III)

wherein L' represents a p-valent linking group, p is an integer of 2 or 3, and X' is represented by the following structure (IV):

-A'(R')$_{n'}$    (IV)

wherein A' represents an n'+1 valent organic group, R' independently represents a hydroxy group, an acrylate ester group [CH$_2$=CHC(=O)O—], or a methacrylate ester group [(CH$_2$=C(CH$_3$)C(=O)O—], and n' is an integer equal to or greater than 1 but less than 6, with the proviso that not all R' groups are hydroxy groups.

L' can be a linear, branched, or cyclic organic group such as a linear, branched, or cyclic hydrocarbon group such as an aliphatic hydrocarbon group. Useful examples of the L' group include a hexamethylene [—(CH$_2$)$_6$—] group, —CH$_2$CH(CH$_3$)CH$_2$C(CH$_3$)$_2$CH$_2$CH$_2$— group, and the following groups:

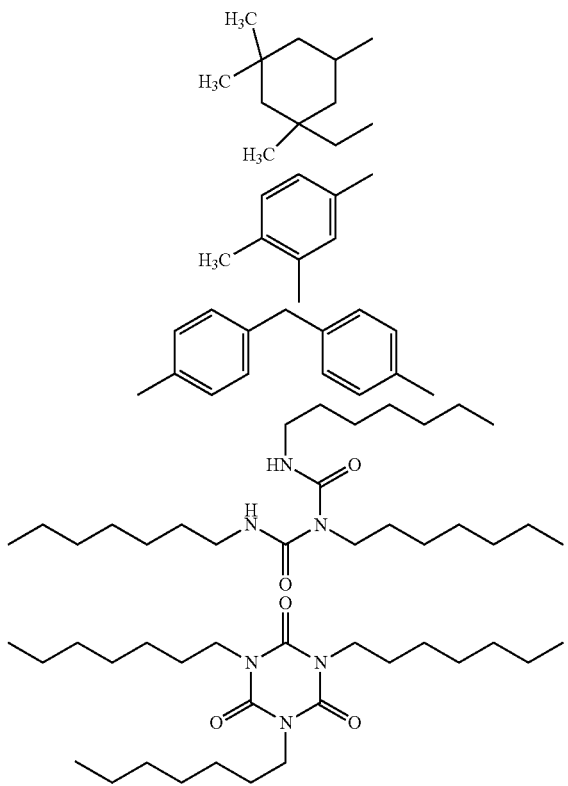

The hexamethylene group is particularly useful for L'.

In structure (IV), a particularly useful example of the A' group is one represented by the following structure (V).

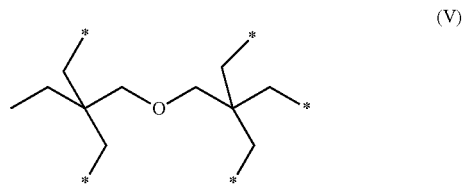 [SMILES: *CC(C*)(C*)COCC(C*)(C*)CC]

(V)

wherein * represents the connecting points to R' groups. Other useful examples of the A' group include —CH$_2$—CH$_2$*, —CH$_2$—CH$_2$—CH$_2$*, —CH$_2$—CH(CH$_3$)*, —CH$_2$—CH (*)—CH$_2$*, —CH(CH$_2$*)$_2$, —C(CH$_2$CH$_3$) (CH$_2$*)$_2$, wherein * also represents the connecting points to R' groups.

Useful urethane (meth)acrylates can be obtained from various commercial sources that would be known to one skilled in the art.

At least one other essential compound of the a) two or more free radically polymerizable components must be a polyester (meth)acrylate, meaning that it can be a polyester acrylate, polyester methacrylate compound, or both types of compounds can be present. Such polyester (meth)acrylates are free of urethane linkages and comprise one or more of the acrylate or methacrylate groups, and two or more ester groups [—OC(=O))*] linked together via the connecting point by a single bond or by a carbon-carbon linking group (carbon chain), Typically, each polyester (meth)acrylate can have from 1 to 15 or from 4 to 15 acrylate or methacrylate groups in each molecule.

In some embodiments, each polyester (meth)acrylate can be represented by the following structure (I):

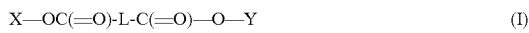

X—OC(=O)-L-C(=O)—O—Y    (I)

wherein L represents a single bond or a carbon chain having at least two connected carbon atoms, and up to and including 10 connected carbon atoms. For example, the L linkage of structure (I) can be a linear, branched, or cyclic saturated hydrocarbon chain comprising 2 to 10 carbon atoms; a linear, branched, or cyclic carbon chain comprising 2 to 10 carbon atoms and at least one carbon-carbon unsaturated group. Such groups can be aromatic or non-aromatic in character.

For example, L can be selected from a single bond, a *CH$_2$—CH$_2$* group, a *CH=CH* group, and either of groups Ia and Ib shown as follows:

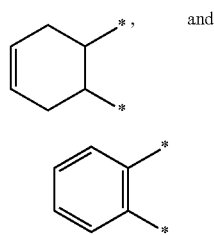

wherein * represents the connecting points to the rest of Structure (I).

Moreover, X and Y in structure (I) can be the same or different, and represent independently a hydrogen atom or an organic group that is represented by structure (II) shown below, with the proviso that X and Y cannot both be hydrogen atoms:

-A(R)$_n$    (II)

wherein A represents an n+1 valent organic group. Useful examples of the A' group in Structure (IV) above can also represent useful examples of A in Structure (II). Among them, —C(CH$_2$CH$_3$)(CH$_2$*)$_2$ is a particularly useful example of A.

R represents a hydroxy group, an acrylate ester group [CH$_2$=CHC(=O)O—], or a methacrylate ester group [CH$_2$=C(CH$_3$)C(=O)—], and n is an integer equal to or greater than 1 but less than 12 (more typically from 1 and up to and including 5), with the proviso that not all R groups are hydroxy groups.

The total amount of the urethane (meth)acrylates and the polyester (meth)acrylates in the negative-working infrared radiation-sensitive image-recording layer is at least 75 weight %, at least 80 weight %, or even at least 90 weight %, and up to and including 90 weight % or up to and including 100 weight %, based on the total weight of all of the a) two or more free radically polymerizable components. When the total amount of the urethane (meth)acrylates and polyester (meth)acrylates is below 75 weight %, the imaged and developed negative-working precursors are likely to exhibit poor on-press printing durability (LOR, defined above) after exposure of the non-exposed and undeveloped negative-working precursors to ambient ozone.

Moreover, the a) two or more free radically polymerizable components are present in an amount of at least 20 weight % or of at least 30 weight %, and up to and including 70 weight % or up to and including 80 weight %, based on the total solids of the negative-working infrared radiation-sensitive image-recording layer in the precursor of the present invention.

As a skilled worker would appreciate, mixtures of urethane (meth)acrylates, mixtures of polyester (meth)acrylates, and mixtures of one or more urethane (meth)acrylates and one or more polyester (meth)acrylates can be used in the present invention.

It is also critical that the weight ratio of the one or more urethane (meth)acrylates to the one or more polyester (meth)acrylates in the a) two or more free radically polymerizable components is from 90:10 to and including 35:65, or from 75:25 to and including 50:50.

Within the a) two or more free radically polymerizable components used in each negative-working infrared radiation-sensitive image-recording layer, it is possible, although not essential, to include one or more additional free radically polymerizable components that are neither urethane (meth)acrylates nor polyester (meth)acrylates, both of which are described above. Such additional compounds are free both of urethane linkages and a structure having at least two ester groups linked together by a single bond or a carbon-carbon chain. When present, such one or more additional free radically polymerizable components can be present in an amount of at least 0.5 weight % but less than 25 weight %, or less than 20 weight %, or even less than 15 weight %, all based on the total weight of the a) two or more free radically polymerizable components.

For example, each of the one or more additional free radically polymerizable components can comprise a glycol ether linkage [—O-M-O—] wherein M represents —CH$_2$—CH$_2$— or CH$_2$—CH(CH$_3$)—.

Representative examples of additional one or more free radically polymerizable components include but are not limited to, NK Ester A-DPH (dipentaerythritol hexaacrylate) that is available from Kowa American, Sartomer SR399 (dipentaerythritol pentaacrylate), Sartomer SR355 (di-trimethylolpropane tetraacrylate), Sartomer SR295 (pentaerythritol tetraacrylate), and Sartomer SR415 [ethoxylated (20) trimethylolpropane triacrylate] that are available from Sartomer Company, Inc. Numerous other useful additional free radically polymerizable components are known in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful additional free radically polymerizable components are also described in EP 1,182,033A1 (Fujimaki et al.), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.) the disclosures of all of which are incorporated herein by reference. Other useful additional free radically polymerizable components include those described in U.S. Patent Application Publication 2009/0142695 (Baumann et al.), which radically polymerizable components include 1H-tetrazole groups, and the disclosure of which publication is incorporated herein by reference.

It is possible for one or more of the a) two or more free radically polymerizable components to have large enough molecular weight or to have sufficient polymerizable groups to provide a crosslinkable polymer matrix that functions as a "polymeric binder" for other components in the negative-working infrared radiation-sensitive image-recording layer. In such embodiments, a distinct non-free radically polymerizable polymer binder (described below) is not necessary but can still be present if desired.

Useful additional free radically polymerizable components can be obtained from various commercial sources in the world, or they can be readily prepared using known starting materials and synthetic methods carried out by skilled synthetic chemists.

Moreover, the present invention utilizes an b) initiator composition in each negative-working infrared radiation-sensitive image-recording layer. Such initiator compositions can comprise one or more compounds that are capable of generating free radicals upon suitable exposure of the imaging chemistry in the negative-working infrared radiation-sensitive image-recording layer, including but not limited to, organohalogen compounds, for example trihaloallyl compounds; trihalomethyl aryl sulfones; bis(trihalomethyl) triazines; and onium salts such as iodonium salts, sulfonium salts, diazonium salts, phosphonium salts, and ammonium salts, many of which are known in the art. For example, representative compounds other than onium salts are described for example in [0087] to [0102] of U.S. Patent Application Publication 2005/0170282 (Inno et al., U.S. '282) and U.S. Pat. No. 6,309,792 (Hauck et al.), the disclosures of both of which are incorporated herein by reference including the numerous cited publications describing such compounds, and also in Japanese Patent Publication 2002/107916 and WO 2019/179995.

Useful onium salts are described for example from [0103] to [0109] of the cited US $282. For example, useful onium salts comprise at least one onium cation in the molecule, and a suitable anion. Examples of the onium salts include triphenylsulfonium, diphenyliodonium, diphenyldiazonium, compounds and derivatives thereof that are obtained by introducing one or more substituents into the benzene ring of these compounds. Suitable substituents include but are not limited to, alkyl, alkoxy, alkoxycarbonyl, acyl, acyloxy, chloro, bromo, fluoro and nitro groups.

Examples of anions in onium salts include but are not limited to, halogen anions, $ClO_4^-$, $PF_6^-$, $BF_4^-$, $SbF_6^-$; $CH_3SO_3^-$; $CF_3SO_3^-$; $C_6H_5SO_3^-$, $CH_3C_6H_4SO_3^-$, $HOC_6H_4SO_3^-$; $ClC_6H_4SO_3^-$, and boron anions (such as tetraaryl borate anions as described for example in U.S. Pat. No. 7,524,614 (Tao et al.)), the disclosure of which is incorporated herein by reference.

Representative useful iodonium salts are described in U.S. Pat. No. 7,524,614 (noted above), in Cols. 6-7 wherein the iodonium cation can contain various listed monovalent substituents "X" and "Y," or fused carbocyclic or heterocyclic rings with the respective phenyl groups.

Useful onium salts can be polyvalent onium salts having at least two onium ions in the molecule that are bonded through a covalent bond. Among polyvalent onium salts, those having at least two onium ions in the molecule are useful and those having a sulfonium or iodonium cation in the molecule are useful.

Furthermore, the onium salts described in paragraphs [0033] to [0038] of the specification of Japanese Patent Publication 2002-082429 [or U.S. Patent Application Publication 2002-0051934 (Nakamura et al.)], the disclosure of which is incorporated herein by reference] or the iodonium borate complexes described in U.S. Pat. No. 7,524,614 (noted above) can also be used. Representative iodonium borate salts are for example, listed in Col. 8 of U.S. U.S. Pat. No. 7,524,614 (noted above). Such iodonium borate salts can include a borate anion represented by the following structure:

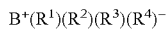

wherein $R^1$, $R^2$, $R^3$, and $R^4$ independently represent substituted or unsubstituted alkyl, aryl, alkenyl, alkynyl, cycloalkyl, or heterocyclic groups each attached to the boron atom, or two or more of $R^1$, $R^2$, $R^3$, and $R^4$ can be joined together to form a heterocyclic ring with the boron atom, such heterocyclic rings each having up to 7 carbon, nitrogen, oxygen, or sulfur atoms. For example, tetraaryl borate anions including tetraphenyl borate, and triarylalkyl borate such as triphenylalkyl borate compounds are useful.

In some embodiments, a combination of onium salts can be used as part of the initiator composition, such as for example a combination of compounds described in U.S. Patent Application Publication 2017/0217149 (Hayashi et al.), the disclosure of which is incorporated herein by reference.

Since the b) initiator composition can have multiple components, it would be readily apparent to one skilled in the art as to the useful amount(s) or dry coverage of the various components of the b) initiator composition in each negative-working infrared radiation-sensitive image-recording layer, based on the knowledge of a skilled artisan and the representative teaching provided herein including the working Examples shown below. Useful materials in the b) initiator composition capable of generating free radicals can be readily obtained from commercial sources in the world, or readily prepared using known starting materials and synthetic methods carried out by a skilled synthetic chemist.

In addition, each of the one or more negative-working infrared radiation-sensitive image-recording layers comprises c) one or more infrared radiation absorbing cyanine dyes to provide desired infrared radiation sensitivity or to convert radiation to heat, or both. Suitable cyanine dyes for this purpose are described in for example, U.S. Pat. No. 5,208,135 (Patel et al.), U.S. Pat. No. 6,153,356 (Urano et al.), U.S. Pat. No. 6,309,792 (Hauck et al.), U.S. Pat. No. 6,569,603 (Furukawa), U.S. Pat. No. 6,797,449 (Nakamura et al.), U.S. Pat. No. 7,018,775 (Tao), U.S. Pat. No. 7,368, 215 (Munnelly et al.), U.S. Pat. No. 8,632,941 (Balbinot et al.), and U.S. Patent Application Publication 2007/056457 (Iwai et al.), the disclosures of all of which are incorporated herein by reference. A suitable cyanine dye comprises a suitable cationic cyanine chromophore and a suitable anion such as a tetraarylborate anion including a tetraphenylborate anion. Examples of such dyes include those described in United States Patent Application Publication 2011/003123 (Simpson et al.), the disclosure of which is incorporated herein by reference.

In addition to low molecular weight IR-absorbing cyanine dyes, IR-absorbing cyanine dye chromophores bonded to polymers can be used as well. Moreover, IR-absorbing cyanine dye cations can be used as well, that is, such cation is the IR absorbing portion of the cyanine dye salt that ionically interacts with a polymer comprising carboxy, sulfo, phospho, or phosphono groups in the side chains.

Also useful in the practice of the present invention as c) infrared radiation absorbing cyanine dyes are the cyanine compounds described as "color-changing compounds" in at least [0088]-[0097] of U.S. Patent Application Publications 2022/0324220A1 (Simpson et al.) and in at least [0091]-[0100] of 2022/0317569A1 (Simpson et al.), and in copending and commonly assigned U.S. Ser. No. 17/844,953, filed Jun. 21, 2022 by Simpson et al. and Ser. No. 18/180,897 filed Mar. 9, 2023 by Simpson et al., the disclosures of all of which are incorporated herein by reference. These color-changing compounds described in this paragraph can be used alone or in combination with infrared radiation absorbing cyanine dyes that do not exhibit significant color changes, including those described in preceding paragraphs, such as the cyanine dyes described in U.S. Pat. No. 6,797,449 (Nakamura et al. noted above).

The total amount of the c) one or more infrared radiation absorbing cyanine dyes is at least 0.5 weight % or at least 1 weight %, and up to and including 15 weight %, or up to and including 30 weight %, based on the total solids of the at least one or more negative-working infrared radiation-sensitive image-recording layers. The noted amount of c) one or more infrared radiation absorbing cyanine dyes can be present in a single or multiple negative-working infrared radiation-sensitive image-recording layers, and the noted amounts represent the total amount in the precursor.

Useful infrared radiation absorbing cyanine dyes can be obtained from various commercial sources in the world, or they can be prepared using known chemical synthetic methods and starting materials as a skilled synthetic chemist would be able to carry out.

It is optional but desirable in some embodiments that a negative-working infrared radiation-sensitive image-recording layer further comprises one or more non-free radically polymerizable polymeric materials (or polymeric binders), each of which does not have any functional groups that, if present, would make the polymeric material capable of free radical polymerization. Thus, such non-free radically polymerizable polymeric materials are different from the a) two or more free radically polymerizable components described above, and they are different materials from all of the b) initiator composition, and c) one or more infrared radiation absorbing cyanine dyes described above.

Useful non-free radically polymerizable polymeric binders generally have a weight average molecular weight ($M_w$) of at least 2,000, or of at least 20,000, and up to and including 300,000 or up to and including 500,000, as determined by Gel Permeation Chromatography (polystyrene standard).

Such non-free radically polymerizable polymeric binder can be selected from polymeric materials known in the art including polymers comprising recurring units having side chains comprising polyalkylene oxide segments such as those described in for example, U.S. Pat. No. 6,899,994 (Huang et al.) the disclosure of which is incorporated herein by reference. Other useful polymeric binders comprise two or more types of recurring units having different side chains comprising polyalkylene oxide segments as described in for example WO Publication 2015-156065 (Kamiya et al.). Some of such polymeric binders can further comprise recurring units having pendant cyano groups as those described in for example U.S. Pat. No. 7,261,998 (Hayashi et al.), the disclosure of which is incorporated herein by reference.

Such non-free radically polymerizable polymeric binders also can have a backbone comprising multiple (at least two) urethane moieties as well as pendant groups comprising the polyalkylenes oxide segments.

Some particularly useful non-free radically polymerizable polymeric binders are present in particulate form, that is, in the form of discrete particles (non-agglomerated particles) that can have an average particle size of at least 10 nm and up to and including 1500 nm, or typically of at least 80 nm and up to and including 600 nm, and that are generally distributed uniformly within the negative-working infrared radiation-sensitive image-recording layer. Some of these polymeric binders can be present in particulate form and have an average particle size of at least 50 nm and up to and including 400 nm. Average particle size can be determined using various known methods and particle measuring equipment, such as by measuring the particles in electron scanning microscope images and averaging a set number of measurements.

Useful non-free radically polymerizable polymeric binder(s) also include water-soluble polymers such as hydroxypropyl cellulose, and polyvinyl alcohol with saponification degree of at least 70 mol %.

The non-free radically polymerizable polymeric binder(s) may be present in an amount of at least 10 weight %, or at least 20 weight %, and up to and including 50 weight %, or up to and including 70 weight %, based on the total solids of each negative-working infrared radiation-sensitive image-recording layer.

Useful non-free radically polymerizable polymeric binders can be obtained from various commercial sources or they can be prepared using known procedures and starting materials, as described for example in publications described above and as known by skilled polymer chemists.

A negative-working infrared radiation-sensitive image-recording layer can optionally include crosslinked polymer particles, such materials having an average particle size of at least 2 µm, or of at least 4 µm, and up to and including 20 µm as described for example in U.S. Pat. No. 9,366,962 (Hayakawa et al.), U.S. Pat. No. 8,383,319 (Huang et al.) and U.S. Pat. No. 8,105,751 (Endo et al), the disclosures of all of which are incorporated herein by reference. Such crosslinked polymeric particles can be present in the hydrophilic protective layer when present (described below), or in both the negative-working infrared radiation-sensitive image-recording layer and the hydrophilic protective layer.

It is optional but desirable in some embodiments that a negative-working infrared radiation-sensitive image-recording layer further comprises one or more acid-sensitive dye precursors. Useful acid-sensitive dye precursors include those described in the section of acid-color former in columns 31, 32, and 33 of U.S. Pat. No. 11,294,279 B2 (Ishiji et al.), and in US Patent Application Publications 2022/0111629 (Enomoto et al.), 2021/0078350 (Viehmann et al.) and 2023/0091079 (Hansmann et al.), the disclosures of all of which are incorporated herein by reference.

A negative-working infrared radiation-sensitive image-recording layer can also include a variety of other optional addenda including but not limited to, dispersing agents, humectants, biocides, plasticizers, surfactants for coatability or other properties, viscosity builders, pH adjusters, drying agents, defoamers, development aids, rheology modifiers, or combinations thereof, or any other addenda commonly used in the lithographic coating art, in conventional amounts. The negative-working infrared radiation-sensitive image-recording layer can also include a phosphate (meth)acrylate having a molecular weight generally greater than 250 as described in U.S. Pat. No. 7,429,445 (Munnelly et al.) the disclosure of which is incorporated herein by reference. Moreover, a negative-working infrared radiation-sensitive image-recording layer can optionally comprise one or more suitable chain transfer agents, antioxidants, or stabilizers (inhibitors) to prevent or moderate undesired radical reactions, as described, for example in [0144] to [0149] of EP 2,735,903B1 (Werner et al.) and in Cols. 7-9 of U.S. Pat. No. 7,189,494 (Munnelly et al.), the disclosure of which is incorporated herein by reference.

The useful dry coverage of a negative-working infrared radiation-sensitive image-recording layer is described below.

Protective Layer:

The negative-working infrared radiation-sensitive image-recording layer can be the outermost layer, but some precursors according to this invention can be designed with a protective layer disposed on the outermost negative-working infrared radiation-sensitive image-recording layer. The protective layer is typically hydrophilic as known in the art, but it can also be hydrophobic or comprise hydrophobic ingredients such as those described in PCT patent application publication WO2019/243036A1. However, for the purpose of protecting a negative-working infrared radiation sensitive image-recording layer according to the present invention, the use of the unique combination of a) two or more free radically polymerizable components described above is advantageous over traditional oxygen-blocking protective layers in that the latter can have undesirable effects, especially for negative-working lithographic printing plate precursors designed for on-press development, including slow ink rollup, contamination of the fountain solution, and reduced image durability due to uncontrolled intermixing between the protective layer and the negative-working infrared radiation sensitive image-recording layer.

Preparing Negative-Working Lithographic Printing Plate Precursors

Negative-working lithographic printing plate precursors according to the present invention can be provided in the following manner. One or more negative-working infrared radiation-sensitive image-recording layer formulations, each comprising essential a), b), and c) components described and other addenda described above, dissolved or dispersed in a suitable solvent, can be applied to a hydrophilic surface of a suitable aluminum-containing substrate as described above, using any suitable equipment and procedure, such as spin coating, knife coating, gravure coating, die coating, slot coating, bar coating, wire rod coating, roller coating, or extrusion hopper coating. Such formulations can also be applied by spraying onto a suitable aluminum-containing substrate. Typically, once the negative-working infrared radiation-sensitive image-recording layer formulation is applied at a suitable wet coverage, it is dried in a suitable manner known in the art to provide a desired dry coverage (solids coverage) as noted below.

A solvent suitable for preparing precursors according to the present invention can be comprised of water and/or one or more organic solvents. Examples of useful organic solvents include methyl ethyl ketone (2-butanone), methanol, ethanol, 1-methoxy-2-propanol, 2-methoxypropanol, isopropyl alcohol, acetone, γ-butyrolactone, n-propanol, tetrahydrofuran, and others readily known in the art.

After proper drying, the dry coverage (or total solids) of each of the at least one or more negative-working infrared radiation-sensitive image-recording layers on the aluminum-containing substrate is generally at least 0.1 $g/m^2$, or at least 0.4 $g/m^2$, and up to and including 2 $g/m^2$ or up to and including 4 $g/m^2$ but other dry coverage amounts can be used if desired.

As described above, in some embodiments, a suitable protective layer formulation (described above) can be applied to the outermost negative-working infrared radiation-sensitive image-recording layer using known coating and drying conditions, equipment, and procedures.

In practical manufacturing conditions, the result of these coating operations is a continuous web (or roll) of negative-working infrared radiation-sensitive lithographic printing plate precursor material having one or more negative-working infrared radiation-sensitive image-recording layers and optionally a protective layer, on a suitable aluminum-containing substrate. Such continuous web of this structure can be slit or cut into appropriately sized precursors for use.

Imaging (Exposing) Conditions

During use, a negative-working infrared radiation-sensitive lithographic printing plate precursor of this invention can be exposed to a suitable source of infrared radiation depending upon the c) infrared radiation absorbing cyanine dye(s) present in the one or more negative-working infrared radiation-sensitive image-recording layers. In some embodiments, the negative-working lithographic printing plate precursors can be imaged with one or more lasers that emit significant infrared radiation within the range of at least 750 nm and up to and including 1400 nm, or of at least 800 nm and up to and including 1250 nm to create exposed regions and non-exposed regions in the one or more negative-working infrared radiation-sensitive image-recording layers. Such infrared radiation-emitting lasers can be used for such imaging in response to digital information supplied by a computing device or other source of digital information. The laser imaging can be digitally controlled in a suitable manner known in the art.

Thus, imaging can be carried out using imaging or exposing infrared radiation from an infrared radiation-generating laser or from an array of such lasers. Imaging also can be carried out using imaging radiation at multiple infrared (or near-IR) wavelengths at the same time if desired. The laser(s) used to expose the precursor is usually a diode laser(s), because of the reliability and low maintenance of diode laser systems, but other lasers such as gas or solid-state lasers can also be used. The combination of power, intensity and exposure time for infrared radiation imaging would be readily apparent to one skilled in the art.

The infrared imaging apparatus can be configured as a flatbed recorder or as a drum recorder, with the infrared radiation-sensitive lithographic printing plate precursor mounted to the interior or exterior cylindrical surface of the drum. An example of useful imaging apparatus is available as models of KODAK® Trendsetter platesetters (Eastman Kodak Company) and NEC AMZISetter X-series (NEC Corporation, Japan) that contain laser diodes that emit radiation at a wavelength of about 830 nm. Other suitable imaging apparatus includes the Screen PlateRite 4300 series or 8600 series platesetters (available from Screen USA, Chicago, IL) or thermal CTP platesetters from Panasonic Corporation (Japan) that operates at a wavelength of 810 nm.

When an infrared radiation imaging source is used, imaging energy intensities can be at least 30 $mJ/cm^2$ and up to and including 500 $mJ/cm^2$ and typically at least 50 $mJ/cm^2$ and up to and including 300 $mJ/cm^2$ depending upon the sensitivity of one or more the infrared radiation-sensitive image-recording layers.

Processing (Development) and Printing

After imagewise exposing as described above, the exposed infrared radiation-sensitive lithographic printing plate precursors having exposed regions and non-exposed regions in each infrared radiation-sensitive image-recording layer can be processed either off-press or on-press to remove the non-exposed regions (and any protective layer over such non-exposed regions) for exposed negative-working infrared radiation-sensitive lithographic printing plate precursors. After this processing, and during lithographic printing, the revealed hydrophilic aluminum-containing substrate surface repels inks while the remaining exposed regions accept lithographic printing ink. On-press processing is particularly preferred and described below.

On-Press Development and Printing:

Some negative-working lithographic printing plate precursors of the present invention are on-press developable using a lithographic printing ink, a fountain solution, or a combination of a lithographic printing ink and a fountain solution. In such embodiments, an imaged (exposed) infrared radiation-sensitive lithographic printing plate precursor according to the present invention is mounted onto a printing press and the printing operation is begun. The non-exposed regions in the infrared radiation-sensitive image-recording layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, IL).

In a typical printing press startup with a sheet-fed printing machine, the dampening roller is engaged first and supplies fountain solution to the mounted imaged precursor to swell the exposed infrared radiation-sensitive image-recording layer at least in the non-exposed regions. After a few revolutions, the inking rollers are engaged and they supply lithographic printing ink(s) to the entire printing surface of the lithographic printing plates. Typically, within 5 to 20 revolutions after the inking roller engagement, printing sheets are supplied to start lithographic printing. The initial press sheets may carry some inks or the infrared radiation-sensitive image-recording layer from the lithographic printing plate in the non-exposed regions. The removal of the one or more infrared radiation-sensitive image-recording layers from the non-exposed regions can be progressing from the engagement of the dampening rollers until the non-exposed regions of the lithographic printing plate precursor no longer transfers inks to the printed sheets.

The present invention provides at least the following embodiments and combinations thereof, but other combinations of features are considered to be within the present invention as a skilled artisan would appreciate from the teaching of this disclosure:

1. A negative-working lithographic printing plate precursor comprising an aluminum-containing substrate, and a negative-working infrared radiation-sensitive image-recording layer disposed on the aluminum-containing substrate, the negative-working infrared radiation-sensitive image-recording layer comprising:

a) two or more free radically polymerizable components;

b) an initiator composition capable of generating free radicals; and c) one or more infrared radiation absorbing cyanine dyes, wherein the a) two or more free radically polymerizable components comprise one or more urethane (meth)acrylates and one or more polyester (meth)acrylates, which together, comprise at least 75 weight % and up to and including 100 weight % of all free radically polymerizable components, wherein the weight ratio of the one or more urethane (meth)acrylates to the one or more polyester (meth) acrylates is from 90:10 to and including 35:65, wherein each of the one or more urethane (meth)acrylates comprises one or more urethane linkages and at least 4 acrylate or methacrylate ester groups, and wherein each of the one or more polyester (meth)acrylates is free of a urethane linkage and is represented by the following structure (I):

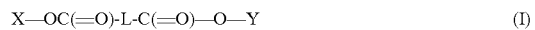

wherein L represents a single bond or a carbon chain, X and Y represent independently a hydrogen atom or an organic group that is represented by structure (II) below, with the proviso that X and Y cannot both be hydrogen atoms,

wherein A represents an n+1 valent organic group, R represents a hydroxy group, an acrylate ester group ($CH_2$=CHC(=O)O—), or a methacrylate ester group ($CH_2$=C($CH_3$)C(=O)O—), and n is an integer equal to or greater than 1 but less than 12, with the proviso that not all R groups are hydroxy groups.

2. The negative-working lithographic printing plate precursor of embodiment 1, wherein the one or more urethane (meth)acrylates and one or more polyester (meth)acrylates, together, comprise at least 80 weight % of all of the a) two or more free radically polymerizable components.

3. The negative-working lithographic printing plate precursor of embodiment 1 or 2, wherein the negative-working infrared radiation-sensitive image-recording layer is the outermost layer.

4. The negative-working lithographic printing plate precursor of any of embodiments 1 to 3 that is on-press developable using a lithographic printing ink, a fountain solution, or a combination of a lithographic printing ink and fountain solution.

5. The negative-working lithographic printing plate precursor of embodiment 3, wherein the L linkage of structure (I) is selected from a single bond, a *$CH_2$—$CH_2$* group, a *CH=CH* group, and either of groups Ia and Ib shown as follows:

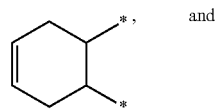

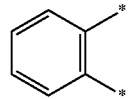

wherein * represents the connecting points to the rest of structure (I)

6. The negative-working lithographic printing plate precursor of any of embodiments 1 to 5, wherein the negative-working infrared radiation-sensitive image-recording layer further comprises a non-radically free polymerizable polymeric binder in particulate form.

7. The negative-working lithographic printing plate precursor of any of embodiments 1 to 6, wherein the a) two or more free radically polymerizable components are present in an amount of at least 20 weight % and up to and including 80 weight %, based on the total solids of the negative-working infrared radiation-sensitive image-recording layer.

8. The negative-working lithographic printing plate precursor of any of embodiments 1 to 7, wherein the aluminum-containing substrate comprises two or more aluminum oxide layers, and a hydrophilic polymer coating that is disposed on an outermost aluminum oxide layer.

9. The negative-working lithographic printing plate precursor of any of embodiments 1 to 8, wherein at least one of the one or more urethane (meth)acrylates comprises at least 5 acrylate or methacrylate groups.

10. The negative-working lithographic printing plate precursor of any of embodiments 1 to 9, wherein at least one of the one or more urethane (meth)acrylates comprises at least 10 acrylate or methacrylate groups.

11. The negative-working lithographic printing plate precursor of any of embodiments 1 to 10, wherein the a) two or more free radically polymerizable components further comprise one or more additional free radically polymerizable components that are all free of a urethane linkage and all free of a structure having at least two ester groups linked together by a bond or a carbon-carbon chain, but each of the one or more additional free radically polymerizable components comprises one or more (meth)acrylate ester groups, and the one or more additional free radically polymerizable components are present in a total amount of less than 25 weight %, based on the total weight of the a) two or more free radically polymerizable components.

12. The negative-working lithographic printing plate precursor of embodiment 11, each of the one or more additional free radically polymerizable components comprises a glycol ether linkage [—O-M-O—], where M represents -$CH_2$—$CH_2$— or $CH_2$—$CH(CH_3)$—.

13. The negative-working lithographic printing plate precursor of any of embodiments 1 to 12, wherein the one or more urethane (meth)acrylates are represented by the following structure (III)

wherein L' represents a p-valent linking group, p is an integer of 2 or 3, and X' is represented by the following structure (IV),

wherein A' represents an n'+1 valent organic group, R independently represents a hydroxy group, an acrylate ester group [$CH_2$=CHC(=O)O—], or a methacrylate ester group [($CH_2$)=C($CH_3$)C(=O)O—], and n' is an integer equal to or greater than 1 but less than 6, with the proviso that not all R' groups are hydroxy groups.

14. The negative-working lithographic printing plate precursor of embodiment 13, wherein L' is a hydrocarbon group.

15. The negative-working lithographic printing plate precursor of claim embodiment 13 or 14, wherein L' is an aliphatic hydrocarbon group.

16. The negative-working lithographic printing plate precursor of any of embodiments 13 to 15, wherein L' is a hexamethylene [—($CH_2$)$_6$—] group.

17. The negative-working lithographic printing plate precursor of any of embodiments 13 to 16, where A' is represented by the following structure (V).

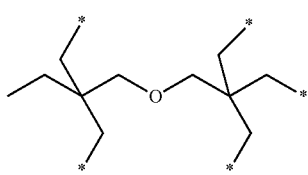

wherein * represents the connecting points to R' groups.

18. A negative-working lithographic printing plate precursor comprising an aluminum-containing substrate comprising two or more aluminum oxide layers, and a negative-working infrared radiation-sensitive image-recording layer disposed as the outermost layer on the aluminum-containing substrate, the negative-working infrared radiation-sensitive image-recording layer comprising:

a) two or more free radically polymerizable components;

b) an initiator composition capable of generating free radicals and comprising an iodonium cation and a tetraaryl borate anion; and c) one or more infrared radiation absorbing cyanine dyes, wherein the a) two or more free radically polymerizable components comprise one or more urethane (meth)acrylates and one or more polyester (meth)acrylates, which together, comprise at least 80 weight % and up to and including 100 weight % of all free radically polymerizable components, wherein the weight ratio of the one or more urethane (meth)acrylates to the one or more polyester (meth)acrylates is from 75:25 to and including 50:50, wherein each of the one or more urethane (meth)acrylates comprises one or more urethane linkages and at least 4 acrylate or methacrylate ester groups and is represented by the following structure (III):

wherein L' represents a p-valent linking group, p is an integer of 2 or 3, and X' is represented by the following structure (IV):

wherein A' represents an n'+1 valent organic group, R' independently represents a hydroxy group, an acrylate ester group [$CH_2$=CHC(=O)O—], or a methacrylate ester group [($CH_2$)=C($CH_3$)C(=O)O—], and n' is an integer equal to or greater than 1 but less than 6, with the proviso that not all R' groups are hydroxy groups, and wherein each of the one or more polyester (meth)acrylates is free of a urethane linkage and is represented by the following structure (I):

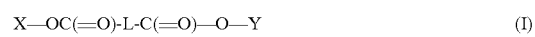

wherein L represents a single bond or is selected from a *$CH_2$—$CH_2$* group, a *CH=CH* group, and either of groups Ia and Ib shown as follows:

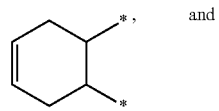

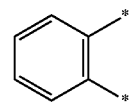

wherein * represents the connecting points to the rest of structure (I), and X and Y represent independently a hydrogen atom or an organic group that is represented by structure (II) below, with the proviso that X and Y cannot both be hydrogen atoms,

wherein A represents an n+1 valent organic group, R represents a hydroxy group, an acrylate ester group ($CH_2$=CHC(=O)O—), or a methacrylate ester group ($CH_2$)=C($CH_3$)C(=O)O—), and n is an integer equal to or greater than 1 but less than 12, with the proviso that not all R groups are hydroxy groups.

19. A method for providing a lithographic printing plate, comprising:

A) imagewise exposing the negative-working lithographic printing plate precursor according to any of embodiments 1 to 18 to imaging infrared radiation, to provide exposed regions and non-exposed regions in the negative-working infrared radiation-sensitive image-recording layer, and B) removing the non-exposed regions in the negative-working infrared radiation-sensitive image-recording layer from the aluminum-containing substrate.

20. The method of embodiment 19 comprising removing the non-exposed regions in the negative-working infrared radiation-sensitive image-recording layer from the aluminum-containing substrate on-press using a lithographic printing ink, a fountain solution, or a combination of a lithographic printing ink and a fountain solution.

The following examples are provided to further illustrate the practice of the present invention and are not meant to be limiting in any manner. Unless otherwise indicated, the materials used in the examples were obtained from various commercial sources as indicated but other commercial sources may be available.

Inventive Examples 1-12 and Comparative Examples 1-14

Preparation of Aluminum-Containing Substrate:

An aluminum-containing substrate was prepared for the lithographic printing plate precursors used in both the Inventive and Comparative lithographic printing plate precursors following the teaching in Invention Example 1 of U.S. Patent Application Publication 2019/0016110 (Merka et al., U.S. '110 hereinafter), the disclosure of which is incorporated herein by reference with respect to the manufacture of aluminum-containing substrates.

In summary, the aluminum-containing substrates was prepared using a Hydro 1052 aluminum alloy strip or web (available from Norsk Hydro ASA, Norway) having a thickness of 0.28 mm as the aluminum-containing "plate" stock or support. Both pre-etch and post-etch steps were carried out in alkaline solutions under known conditions. Roughening (or graining) was carried out by electrochemical means in a hydrochloric acid solution at about 23° C. to obtain an arithmetic average roughness (Ra) of 0.5 μm on a planar surface of the aluminum-containing support. These treatment steps were carried out in a continuous process on a typical manufacturing line used to manufacture lithographic printing plate precursors. The resulting grained and etched aluminum-containing support was then rinsed with water, dried, and cut into individual grained and etched aluminum-containing sheets. Each individual sheet was then anodized twice wherein each anodizing process bath contained about 100 liters of anodizing solution. The first and second anodizing conditions are shown in TABLE I of U.S. '110. The first anodizing process to form the outer aluminum oxide layer was carried out using phosphoric acid as the electrolyte and the second anodizing process to form the inner aluminum oxide layer was carried out using sulfuric acid as the electrolyte. Details as to other features of the aluminum-containing substrates prepared in this manner are described for Invention Example 1 in TABLE II of U.S. '110.

Hydrophilic layers were disposed on the prepared aluminum-containing substrates in the following manner.

Preparation of Hydrophilic Layer Formulation:

Polymer 1, a copolymer derived from vinyl phosphonic acid and acrylamide (mol ratio of 1:9) was prepared by charging 3500 g of ethanol into a 10 liter reaction vessel having a condenser followed by heating at 70° C. Then, 231.1 g of vinyl phosphonic acid monomer and 1368.9 g of acrylamide monomer were mixed into 1000 g of ethanol, and 52 g of AIBN polymerization initiator were dissolved into the monomer mixture. The resulting polymerization mixture was added dropwise into the reaction vessel at 70° C. over 4 hours. After this addition, the polymerization mixture was kept at 70° C. for 2 hours and then cooled down to room temperature. The precipitated white powder copolymer was isolated by filtration and washed with 1 liter of ethanol to provide a yield of 1550 g.

The hydrophilic layer compositions SL-1 and SL-2 to be disposed on the treated and anodized aluminum-containing support were prepared from the components shown in the following TABLE I.

TABLE I

| Component (in grams) | SL-1 | SL-2 |
|---|---|---|
| ACUMER ™ 1000 Polymer | 0.200 | 0 |
| Polymer 1 prepared as above | 0 | 0.025 |
| 85% Phosphoric acid | 0.880 | 0 |
| 28% Ammonia solution | 0.360 | 0 |
| SIPOMER ® PAM-100 | 0 | 0.016 |
| TAKESURF ® D-410-GL | 0.050 | 0.050 |
| Deionized water | 98.510 | 99.909 |
| Total | 100 | 100 |

ACUMER™ 1000 Polymer is an aqueous solution (50 weight %) of poly(acrylic acid) that was obtained from The Dow Chemical Company.

TAKSURF® D-410-GL is a leveling agent that was obtained from TAKEMOTO OIL & FAT CO., LTD.

Each of the hydrophilic layer formulations described in TABLE I was coated on a sample of the aluminum-containing support described above, using a wire-wound coating bar to provide a wet coverage weight of 20 g/m², followed by drying at 80° C. for 2 minutes.

Preparation of Negative-Working Infrared Radiation-Sensitive Image-Recording Layer Formulations:

These formulations (MC-1 through MC-26) were prepared having the components shown in the following TABLE II, each having a dissolved or dispersed total solids of 5 weight % in a coating solvent mixture containing 35 weight % of n-propanol. 20 weight % of 2-methoxy propanol. 35 weight % of 2-butanone, and 10 weight % of water. The raw materials noted in the following TABLE III can be obtained from one or more commercial sources of chemicals or prepared by one of ordinary skill in the art using known synthetic methods.

TABLE II

| Component | Content (%) | | | | | |
|---|---|---|---|---|---|---|
| | MC-1 | MC-2 | MC-3 | MC-4 | MC-5 | MC-6 |
| Polymer 2 | 35.0 | 35.0 | 35.0 | 35.0 | 35.0 | 35.0 |
| Polymer 3 | 5.0 | 5.0 | 5.0 | 5.0 | 5.0 | 5.0 |
| Monomer 1 | 28.0 | 28.0 | 28.0 | 31.5 | 21.0 | 25.2 |
| Monomer 2 | 14.0 | — | — | 10.5 | 21.0 | 12.6 |
| Monomer 3 | — | 14.0 | — | — | — | — |
| Monomer 4 | — | — | 14.0 | — | — | — |
| Monomer 5 | — | — | — | — | — | 4.2 |
| Monomer 6 | — | — | — | — | — | — |
| Initiator 1 | 10.0 | 10.0 | 10.0 | 10.0 | 10.0 | 10.0 |
| IR Dye 1 | 3.0 | 3.0 | 3.0 | 3.0 | 3.0 | 3.0 |
| IR Dye 2 | — | — | — | — | — | — |
| Leuco Dye 1 | 4.0 | 4.0 | 4.0 | 4.0 | 4.0 | 4.0 |
| Surfactant 1 | 1.0 | 1.0 | 1.0 | 1.0 | 1.0 | 1.0 |
| Total | 100.0 | 100.0 | 100.0 | 100.0 | 100.0 | 100.0 |
| (UA + PEA)/AA | 100% | 100% | 100% | 100% | 100% | 90% |
| UA/(UA + PEA) | 67% | 67% | 67% | 75% | 50% | 67% |

| Component | Content (%) | | | | | | |
|---|---|---|---|---|---|---|---|
| | MC-7 | MC-8 | MC-9 | MC-10 | MC-11 | MC-12 | MC-13 |
| Polymer 2 | 35.0 | 35.0 | 35.0 | 35.0 | 35.0 | 35.0 | 35.0 |
| Polymer 3 | 5.0 | 5.0 | 5.0 | 5.0 | 5.0 | 5.0 | 5.0 |
| Monomer 1 | 28.0 | 28.0 | 42.0 | 40.0 | 14.0 | — | 18.7 |
| Monomer 2 | — | — | — | 2.0 | 28.0 | 42.0 | 9.3 |
| Monomer 3 | — | — | — | — | — | — | — |
| Monomer 4 | — | — | — | — | — | — | — |
| Monomer 5 | 14.0 | — | — | — | — | — | 14.0 |
| Monomer 6 | — | 14.0 | — | — | — | — | — |
| Initiator 1 | 10.0 | 10.0 | 10.0 | 10.0 | 10.0 | 10.0 | 10.0 |
| IR Dye 1 | 3.0 | 3.0 | 3.0 | 3.0 | 3.0 | 3.0 | 3.0 |
| IR Dye 2 | — | — | — | — | — | — | — |
| Leuco Dye 1 | 4.0 | 4.0 | 4.0 | 4.0 | 4.0 | 4.0 | 4.0 |
| Surfactant 1 | 1.0 | 1.0 | 1.0 | 1.0 | 1.0 | 1.0 | 1.0 |
| Total | 100.0 | 100.0 | 100.0 | 100.0 | 100.0 | 100.0 | 100.0 |
| (UA + PEA)/AA | 67% | 67% | 100% | 100% | 100% | 100% | 67% |
| UA/(UA + PEA) | 100% | 100% | 100% | 95% | 33% | 0% | 67% |

| Component | Content (%) | | | | | |
|---|---|---|---|---|---|---|
| | MC-14 | MC-15 | MC-16 | MC-17 | MC-18 | MC-19 |
| Polymer 2 | 35.0 | 35.0 | 35.0 | 35.0 | 35.0 | 35.0 |
| Polymer 3 | 5.0 | 5.0 | 5.0 | 5.0 | 5.0 | 5.0 |
| Monomer 1 | 28.0 | 28.0 | 28.0 | 31.5 | 21.0 | 25.2 |
| Monomer 2 | 14.0 | — | — | 10.5 | 21.0 | 12.6 |
| Monomer 3 | — | 14.0 | — | — | — | — |
| Monomer 4 | — | — | 14.0 | — | — | — |
| Monomer 5 | — | — | — | — | — | 4.2 |
| Monomer 6 | — | — | — | — | — | — |
| Initiator 1 | 10.0 | 10.0 | 10.0 | 10.0 | 10.0 | 10.0 |
| IR Dye 1 | — | — | — | — | — | — |
| IR Dye 2 | 3.0 | 3.0 | 3.0 | 3.0 | 3.0 | 3.0 |
| Leuco Dye 1 | 4.0 | 4.0 | 4.0 | 4.0 | 4.0 | 4.0 |
| Surfactant 1 | 1.0 | 1.0 | 1.0 | 1.0 | 1.0 | 1.0 |
| Total | 100.0 | 100.0 | 100.0 | 100.0 | 100.0 | 100.0 |
| (UA + PEA)/AA | 100% | 100% | 100% | 100% | 100% | 90% |
| UA/(UA + PEA) | 67% | 67% | 67% | 75% | 50% | 67% |

| Component | Content (%) | | | | | | |
|---|---|---|---|---|---|---|---|
| | MC-20 | MC-21 | MC-22 | MC-23 | MC-24 | MC-25 | MC-26 |
| Polymer 2 | 35.0 | 35.0 | 35.0 | 35.0 | 35.0 | 35.0 | 35.0 |
| Polymer 3 | 5.0 | 5.0 | 5.0 | 5.0 | 5.0 | 5.0 | 5.0 |
| Monomer 1 | 28.0 | 28.0 | 42.0 | 40.0 | 14.0 | — | 18.7 |
| Monomer 2 | — | — | — | 2.0 | 28.0 | 42.0 | 9.3 |
| Monomer 3 | — | — | — | — | — | — | — |
| Monomer 4 | — | — | — | — | — | — | — |
| Monomer 5 | 14.0 | — | — | — | — | — | 14.0 |
| Monomer 6 | — | 14.0 | — | — | — | — | — |
| Initiator 1 | 10.0 | 10.0 | 10.0 | 10.0 | 10.0 | 10.0 | 10.0 |
| IR Dye 1 | — | — | — | — | — | — | — |

TABLE II-continued

| | | | | | | | |
|---|---|---|---|---|---|---|---|
| IR Dye 2 | 3.0 | 3.0 | 3.0 | 3.0 | 3.0 | 3.0 | 3.0 |
| Leuco Dye 1 | 4.0 | 4.0 | 4.0 | 4.0 | 4.0 | 4.0 | 4.0 |
| Surfactant 1 | 1.0 | 1.0 | 1.0 | 1.0 | 1.0 | 1.0 | 1.0 |
| Total | 100.0 | 100.0 | 100.0 | 100.0 | 100.0 | 100.0 | 100.0 |
| (UA + PEA)/AA | 67% | 67% | 100% | 100% | 100% | 100% | 67% |
| UA/(UA + PEA) | 100% | 100% | 100% | 95% | 33% | 0% | 67% |

In TABLE II, "AA" represents the total weight of all of the b) two or more free radically polymerizable components, "UA" represents the total weight of the one or more urethane (meth)acrylates, and "PEA" represents the total weight of the one or more polyester (meth)acrylates. Thus, "(UA+PEA)/AA" represents the fraction of the total weight of one or more urethane (meth)acrylates and one or more polyester (meth)acrylates in all of the c) two or more free radically polymerizable components, and should be at least 75 weight % according to the present invention. "PU/(UA+PEA)" represents the fraction of the total weight of the one or more urethane (meth)acrylates in the total weight of the combination of the one or more urethane (meth)acrylates and the one or more polyester (meth)acrylates, and should be in the range from 35 weight % to and including 90 weight % according to the present invention.

TABLE III

| | |
|---|---|
| Polymer 2 | Copolymer derived from acrylonitrile, styrene, and polyethylene glycol methyl ether methacrylate (Molecular weight of 2000) applied from a polymer dispersion and prepared like Polymer A in U.S. Pat. No. 7,592,128 (Huang et al.), the disclosure of which is incorporated herein by reference |
| Polymer 3 | Hydroxypropyl cellulose having a weight average molecule of about 80,000 |
| Monomer 1 | UN-904 obtained from Negami Chemical Corporation, polyfunctional urethane acrylate |
| Monomer 2 | ARONIX ® M-7100, from TOAGOSEI CO., LTD. |
| Monomer 3 | ARONIX ® M-8060, from TOAGOSEI CO., LTD. |
| Monomer 4 | ARONIX ® M-8100, from TOAGOSEI CO., LTD. |
| Monomer 5 | SR494, from ARKEMA |
| Monomer 6 | SR399, from ARKEMA |
| IR dye 1 | [structure shown] |
| IR dye 2 | [structure shown] |
| Leuco dye 1 | [structure shown] |
| Surfactant 1 | BYK ® 302 from Byk Chemie, used as a 25 weight % solution in 1-methoxy-2-propanol |
| Initiator 1 | Bis(t-butylphenyl) iodonium tetraphenyl borate |

Each negative-working infrared radiation-sensitive image-recording layer formulation was coated on the hydrophilic layer of an appropriate aluminum-containing substrate using a wire-wound coating bar on sublayer coated substrate and dried 80° C. for 2 minutes to provide a negative-working infrared radiation-sensitive image-recording layer having a dry coverage of 1 g/m².

The resulting negative-working lithographic printing plate precursors (both inventive examples and comparative examples) having an outermost negative-working, infrared radiation-sensitive image-recording layer are identified in the following TABLE IV.

TABLE IV

| Example | Hydrophilic Layer in Aluminum-containing Substrate | Negative-working Infrared Radiation-sensitive Image-Recording Layer Formulation |
|---|---|---|
| Inventive 1 | SL-1 | MC-1 |
| Inventive 2 | SL-1 | MC-2 |
| Inventive 3 | SL-1 | MC-3 |
| Inventive 4 | SL-1 | MC-4 |
| Inventive 5 | SL-1 | MC-5 |
| Inventive 6 | SL-1 | MC-6 |
| Inventive 7 | SL-2 | MC-14 |
| Inventive 8 | SL-2 | MC-15 |
| Inventive 9 | SL-2 | MC-16 |
| Inventive 10 | SL-2 | MC-17 |
| Inventive 11 | SL-2 | MC-18 |
| Inventive 12 | SL-2 | MC-19 |
| Comparative 1 | SL-1 | MC-7 |
| Comparative 2 | SL-1 | MC-8 |
| Comparative 3 | SL-1 | MC-9 |
| Comparative 4 | SL-1 | MC-10 |
| Comparative 5 | SL-1 | MC-11 |
| Comparative 6 | SL-1 | MC-12 |
| Comparative 7 | SL-1 | MC-13 |
| Comparative 8 | SL-2 | MC-20 |
| Comparative 9 | SL-2 | MC-21 |
| Comparative 10 | SL-2 | MC-22 |
| Comparative 11 | SL-2 | MC-23 |
| Comparative 12 | SL-2 | MC-24 |
| Comparable 13 | SL-2 | MC-25 |
| Comparable 14 | SL-2 | MC-26 |

Evaluation of Negative-Working Lithographic Printing Plate Precursors:

Each of the Inventive and Comparative precursors obtained as described above was imaged using a KODAK Magnus 800 image setter at an exposure energy in a solid area of 150 mJ/cm². Each of the Inventive and Comparative precursors were also evaluated for several properties described as follows.

On-Press Developability (DOP):

Each of the negative-working lithographic printing plate precursors was imaged as noted above and mounted onto a Roland R-201 press machine for on-press development. A fountain solution [Presarto WS 100 marketed by DIC Graphics)/isopropyl alcohol/water Jan. 1, 1998 (volume ratio)], a blanket of S-7400 (Kin-yo-sha), OK topcoat paper matte N grade paper (Oji paper) as printing paper and lithographic printing ink (Fusion G Magenta N marketed by DIC Graphics) were supplied to the printing press, and printing was performed at printing rate of 9,000 sheets/hour. On-press developability (DOP) was evaluated by the number of printed paper sheets after which no ink transfer was observed in the non-imaging areas.

DOP was evaluated after each of the negative-working lithographic printing plate precursors had been kept in the following two ways. Firstly, samples of each of the Inventive of Comparative negative-working lithographic printing plate precursors were packaged with a light shielding paper immediately after manufacture and stored at 25° C. for 7 days (keeping identified as 'NK7'). Secondly, samples of each of the Inventive and Comparative negative-working lithographic printing plate precursors were stored in a commercially available humidity chamber ETAC FX-430 at 50° C. for 7 days (keeping identified as 'DT7').

For all evaluations, a DOP of less than 50 sheets is highly desirable and a DOP of more than 100 sheets is unacceptable under the demonstrated printing press conditions that are consistent with commercial lithographic conditions. The smaller the differences ("gaps") in DOP between NK7 and DT7, the better is the precursor imaging stability over time after its manufacture.

Press Life (after No Exposure to Ozone):

A sample of each of the negative-working lithographic printing plate precursors was exposed to infrared radiation as noted above at a rate of 150 mJ/cm². These samples had not been exposed to ambient ozone to any significant extent. The exposed precursors were then mounted on a Komori S-26 press machine operated at 8,000 rpm and printing press life (durability) was evaluated using 1.3% of CDS503 (TOKYO PRINTING INK MFG) in water as the fountain solution, a blanket of S-7400 (Kin-yo-sha), OK topcoat paper matte N grade paper (Oji paper) as printable paper, and K Magenta N grade as the lithographic printing ink (DIC Graphics).

When the number of printed paper sheets increased by continued printing, the infrared radiation-exposed negative-working image-recording layer of each negative-working lithographic printing plate was gradually worn away, and the ink receptivity thereof was deteriorated. Thus, the lithographic printing ink density on the printed paper sheets became reduced as printing continued. Press life (printing durability) was determined as the number of copies when the reflection density of solid area on the obtained copy was reduced to 90% of that reflection density observed when printing press printing started. The greater the number of the printed paper sheets obtained when this reflection density degradation occurred, the better the press life (printing durability) of the lithographic printing plate.

Press Life (after Exposure to Ozone):

Another sample of each of the negative-working lithographic printing plate precursors was exposed to a controlled amount of ozone inside of a commercially available humidity chamber ETAC FX-430 where the ozone concentration was controlled at 1 ppm and the chamber temperature was controlled at 25° C. The following equipment was used for controlling the ozone concentration in the humidity chamber:

A Kotohira portable ozone generator KPO-TO1 was used as the ozone source, and a Kanomax Gasmaster model 2750 was used as the ozone monitor in the humidity chamber.

The ozone exposure times were 1 hour and 6 hours, corresponding to ozone exposure doses of 3,600 ppm's and 21,600 ppm-s, respectively. In the unit "ppm's," "ppm" is a unit of ozone concentration in parts per million by volume and "s" is for second, a unit of time.

After this ozone exposure, each sample of the negative-working lithographic printing plate precursors was evaluated for press life (printing durability) in the same manner as described above.

The results of the on-press developability (DOP) and press life (printing durability) tests are shown in the following TABLE V.

TABLE V

| | DOP (Sheets) | | | Press life (impressions) | | |
| | | | Gap | Ozone exposure (ppm · s) | | |
| Example | NK7 | DT7 | (DT7-NK7) | 0 | 3,600 | 21,600 |
|---|---|---|---|---|---|---|
| Inventive 1 | 30 | 30 | 0 | 100,000 | 100,000 | 90,000 |
| Inventive 2 | 30 | 30 | 0 | 100,000 | 100,000 | 90,000 |
| Inventive 3 | 35 | 40 | 5 | 100,000 | 100,000 | 95,000 |
| Inventive 4 | 40 | 45 | 5 | 100,000 | 100,000 | 90,000 |
| Inventive 5 | 25 | 25 | 0 | 90,000 | 90,000 | 85,000 |
| Inventive 6 | 28 | 28 | 0 | 100,000 | 95,000 | 90,000 |
| Inventive 7 | 27 | 27 | 0 | 120,000 | 115,000 | 100,000 |
| Inventive 8 | 28 | 28 | 0 | 120,000 | 115,000 | 100,000 |
| Inventive 9 | 30 | 35 | 5 | 120,000 | 115,000 | 110,000 |
| Inventive 10 | 35 | 40 | 5 | 120,000 | 115,000 | 100,000 |
| Inventive 11 | 22 | 22 | 0 | 95,000 | 90,000 | 90,000 |
| Inventive 12 | 25 | 25 | 0 | 120,000 | 105,000 | 90,000 |
| Comparative 1 | 25 | 25 | 0 | 100,000 | <5,000 | <5,000 |
| Comparative 2 | 30 | 30 | 0 | 100,000 | <5,000 | <5,000 |
| Comparative 3 | 90 | 200 | 110 | 100,000 | 100,000 | 90,000 |
| Comparative 4 | 80 | 130 | 50 | 100,000 | 100,000 | 90,000 |
| Comparative 5 | 25 | 25 | 0 | 45,000 | 40,000 | 35,000 |
| Comparative 6 | 20 | 20 | 0 | 40,000 | 35,000 | 30,000 |
| Comparative 7 | 23 | 23 | 0 | 90,000 | <5,000 | <5,000 |
| Comparative 8 | 20 | 20 | 0 | 120,000 | <5,000 | <5,000 |
| Comparative 9 | 25 | 25 | 0 | 120,000 | <5,000 | <5,000 |
| Comparative 10 | 90 | 200 | 110 | 80,000 | 65,000 | 55,000 |
| Comparative 11 | 80 | 130 | 50 | 90,000 | 70,000 | 65,000 |
| Comparative 12 | 22 | 22 | 0 | 50,000 | 45,000 | 40,000 |
| Comparative 13 | 20 | 20 | 0 | 40,000 | 35,000 | 30,000 |
| Comparative 14 | 20 | 20 | 0 | 95,000 | <5,000 | <5,000 |

From the results shown in TABLE V, several conclusion can be drawn by one of ordinary skill in the lithographic art. The negative-working lithographic printing plate precursors described and prepared for Inventive Examples 1-12 contained appropriate quantities of the required one or more urethane (meth)acrylates and one or more polyester (meth) acrylates within the a) two or more free radically polymerizable components in the negative-working infrared radiation-sensitive image-recording layer. It was observed that these precursors exhibited desirably fast DOP for both the NK7 and DT7 keeping tests, as well as a desirably small DOP "gap" and desirable long press life (printing durability) regardless of the amount of their exposure to ambient ozone.

The precursors of Comparative Examples 1, 2, 8, and 9 did not contain the required polyester (meth)acrylates in the a) two or more free radically polymerizable components, but instead had additional free radically polymerizable component SR494 and SR399 that are neither polyurethane (meth) acrylates nor polyester (meth)acrylates. The (UA+PEA)/AA value in TABLE II also falls below the required minimum of 75% weight % and the UA/(UA+PEA) value was above the specified upper limit of 90 weight %. These precursors exhibited desirably fast DOP after the NK7 and DT7 keeping tests as well as a desirably small DOP "gap" when not exposed to ambient ozone. However, they exhibited undesirably poor press life (printing durability) after they had been exposed to ambient ozone.

The precursors of Comparative Examples 3, 4, 10, and 11 contained less than the specified amounts polyester (meth) acrylates relative to urethane (meth)acrylates in the a) two or more free radically polymerizable components. While the (UA+PEA)/AA value in TABLE II was within the required range of at least 75 weight %, the UA/(UA+PEA) value was above the specified upper limit of 90 weight %. These precursors exhibited desirably long press life (printing durability) regardless of exposure to ambient ozone. However, they exhibited extremely slow and undesirable DOP after the DT7 keeping test and they also exhibited an undesirably large DOP "gap".

The precursors of Comparative Examples 5, 6, 12, and 13 contained more than the specified amount of the polyester (meth)acrylates relative to the urethane (meth)acrylates in the a) two or more free radically polymerizable components. While the (UA+PEA)/AA value in TABLE II was within the required range of at least 75 weight %, the UA/(UA+PEA) value fell below the specified lower limit of 35 weight %. These precursors exhibited desirably fast DOP after both NK7 and DT7 keeping tests, and also exhibited a desirably small DOP "gap". However, they exhibited undesirably poor press life (printing durability), regardless of the amount of ozone exposure.

The precursors of Comparative Examples 7 and 14 contained an additional free radically polymerizable component such and the total amount of the urethane (meth)acrylates and the polyester (meth)acrylates fell below the required amount to be within the a) two or more free radically polymerizable components. The (UA+PEA)/AA value in TABLE II fell below the required range of at least 75 weight %, even though the UA/(UA+PEA) value was within the specified range of at least 35 weight % and up to and including 90 weight %. These precursors exhibited desirably fast DOP after both NK7 and DT7 keeping tests, as well as a desirably small DOP "gap". However, they exhibited poor press life (printing durability) after exposure to ambient ozone.

The invention has been described in detail with particular reference to certain preferred embodiments thereof, but it will be understood that variations and modifications can be effected within the spirit and scope of the invention.

The invention claimed is:

1. A negative-working lithographic printing plate precursor comprising an aluminum-containing substrate, and a negative-working infrared radiation-sensitive image-recording layer disposed on the aluminum-containing substrate, the negative-working infrared radiation-sensitive image-recording layer comprising:

a) two or more free radically polymerizable components;

b) an initiator composition capable of generating free radicals; and c) one or more infrared radiation absorbing cyanine dyes, wherein the a) two or more free radically polymerizable components comprise one or more urethane (meth)acrylates and one or more polyester (meth)acrylates, which together, comprise at least 75 weight % and up to and including 100 weight % of all free radically polymerizable components, wherein the weight ratio of the one or more urethane (meth)acrylates to the one or more polyester (meth)acrylates is from 90:10 to and including 35:65, wherein each of the one or more urethane (meth)acrylates comprises one or more urethane linkages and at least 4 acrylate or methacrylate ester groups, and wherein each of the one or more polyester (meth)acrylates is free of a urethane linkage and is represented by the following structure (I):

wherein L represents a single bond or a carbon chain, X and Y represent independently a hydrogen atom or an organic group that is represented by structure (II) below, with the proviso that X and Y cannot both be hydrogen atoms,

wherein A represents an n+1 valent organic group, R represents a hydroxy group, an acrylate ester group $(CH_2=CHC(=O)O-)$, or a methacrylate ester group $(CH_2=C(CH_3)C(=O)O-)$, and n is an integer equal to or greater than 1 but less than 12, with the proviso that not all R groups are hydroxy groups.

2. The negative-working lithographic printing plate precursor of claim 1, wherein the one or more urethane (meth)acrylates and one or more polyester (meth)acrylates, together, comprise at least 80 weight % of all of the a) two or more free radically polymerizable components.

3. The negative-working lithographic printing plate precursor of claim 1, wherein the negative-working infrared radiation-sensitive image-recording layer is the outermost layer.

4. The negative-working lithographic printing plate precursor of claim 1 that is on-press developable using a lithographic printing ink, a fountain solution, or a combination of a lithographic printing ink and fountain solution.

5. The negative-working lithographic printing plate precursor of claim 3, wherein the L linkage of structure (I) is selected from a single bond, a *$CH_2$—$CH_2$* group, a *CH=CH* group, and either of groups Ia and Ib shown as follows:

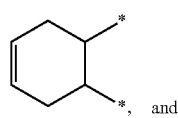

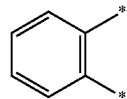

wherein * represents the connecting points to the rest of structure (I).

6. The negative-working lithographic printing plate precursor of claim 1, wherein the negative-working infrared radiation-sensitive image-recording layer further comprises a non-radically free polymerizable polymeric binder in particulate form.

7. The negative-working lithographic printing plate precursor of claim 1, wherein the a) two or more free radically polymerizable components are present in an amount of at least 20 weight % and up to and including 80 weight %, based on the total solids of the negative-working infrared radiation-sensitive image-recording layer.

8. The negative-working lithographic printing plate precursor of claim 1, wherein the aluminum-containing substrate comprises two or more aluminum oxide layers, and a hydrophilic polymer coating that is disposed on an outermost aluminum oxide layer.

9. The negative-working lithographic printing plate precursor of claim 1, wherein at least one of the one or more urethane (meth)acrylates comprises at least 5 acrylate or methacrylate groups.

10. The negative-working lithographic printing plate precursor of claim 1, wherein at least one of the one or more urethane (meth)acrylates comprises at least 10 acrylate or methacrylate groups.

11. The negative-working lithographic printing plate precursor of claim 1, wherein the a) two or more free radically polymerizable components further comprise one or more additional free radically polymerizable components that are all free of a urethane linkage and all free of a structure having at least two ester groups linked together by a bond or a carbon-carbon chain, but each of the one or more additional free radically polymerizable components comprises one or more (meth)acrylate ester groups, and the one or more additional free radically polymerizable components are present in a total amount of less than 25 weight %, based on the total weight of the a) two or more free radically polymerizable components.

12. The negative-working lithographic printing plate precursor of claim 11, each of the one or more additional free radically polymerizable components comprises a glycol ether linkage [—O-M-O—], where M represents —$CH_2$—$CH_2$— or $CH_2$—$CH(CH_3)$—.

13. The negative-working lithographic printing plate precursor of claim 1, wherein the one or more urethane (meth)acrylates are represented by the following structure (III)

wherein L' represents a p-valent linking group, p is an integer of 2 or 3, and X' is represented by the following structure (IV),

wherein A' represents an n'+1 valent organic group, R' independently represents a hydroxy group, an acrylate ester group $[CH_2=CHC(=O)O-]$, or a methacrylate ester group $[(CH_2)=C(CH_3)C(=O)O-]$, and n' is an integer equal to or greater than 1 but less than 6, with the proviso that not all R' groups are hydroxy groups.

14. The negative-working lithographic printing plate precursor of claim 13, wherein L' is a hydrocarbon group.

15. The negative-working lithographic printing plate precursor of claim 13, wherein L' is an aliphatic hydrocarbon group.

16. The negative-working lithographic printing plate precursor of claim 13, wherein L' is a hexamethylene [—(CH$_2$)$_6$—] group.

17. The negative-working lithographic printing plate precursor of claim 13, where A' is represented by the following structure (V):

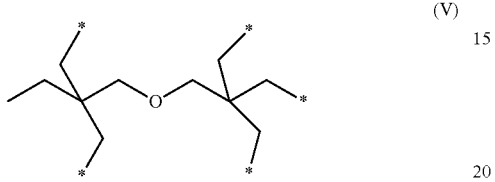

(V)

wherein * represents the connecting points to R' groups.

18. A negative-working lithographic printing plate precursor comprising an aluminum-containing substrate comprising two or more aluminum oxide layers, and a negative-working infrared radiation-sensitive image-recording layer disposed as the outermost layer on the aluminum-containing substrate, the negative-working infrared radiation-sensitive image-recording layer comprising:
a) two or more free radically polymerizable components;
b) an initiator composition capable of generating free radicals and comprising an iodonium cation and a tetraaryl borate anion; and
c) one or more infrared radiation absorbing cyanine dyes, wherein the a) two or more free radically polymerizable components comprise one or more urethane (meth)acrylates and one or more polyester (meth)acrylates, which together, comprise at least 80 weight % and up to and including 100 weight % of all free radically polymerizable components, wherein the weight ratio of the one or more urethane (meth)acrylates to the one or more polyester (meth)acrylates is from 75:25 to and including 50:50, wherein each of the one or more urethane (meth)acrylates comprises one or more urethane linkages and at least 4 acrylate or methacrylate ester groups and is represented by the following structure (III):

(III)

wherein L' represents a p-valent linking group, p is an integer of 2 or 3, and X' is represented by the following structure (IV):

(IV)

wherein A' represents an n'+1 valent organic group, R' independently represents a hydroxy group, an acrylate ester group [CH$_2$═CHC(═O)O—], or a methacrylate ester group [(CH$_2$)═C(CH$_3$)C(═O)O—], and n' is an integer equal to or greater than 1 but less than 6, with the proviso that not all R' groups are hydroxy groups, and wherein each of the one or more polyester (meth)acrylates is free of a urethane linkage and is represented by the following structure (I):

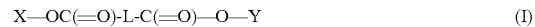

(I)

wherein L represents a single bond or is selected from a *CH$_2$—CH$_2$* group, *CH═CH* group, and either of groups Ia and Ib shown as follows:

(Ia)

, and

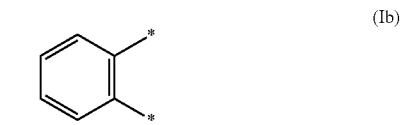

(Ib)

wherein * represents the connecting points to the rest of structure (I), and X and Y represent independently a hydrogen atom or an organic group that is represented by structure (II) below, with the proviso that X and Y cannot both be hydrogen atoms,

(II)

wherein A represents an n+1 valent organic group, R represents a hydroxy group, an acrylate ester group (CH$_2$═CHC(═O)O—), or a methacrylate ester group (CH$_2$═C(CH$_3$)C(═O)O—), and n is an integer equal to or greater than 1 but less than 12, with the proviso that not all R groups are hydroxy groups.

19. A method for providing a lithographic printing plate, comprising:
A) imagewise exposing the negative-working lithographic printing plate precursor according to claim 1 to imaging infrared radiation, to provide exposed regions and non-exposed regions in the negative-working infrared radiation-sensitive image-recording layer, and
B) removing the non-exposed regions in the negative-working infrared radiation-sensitive image-recording layer from the aluminum-containing substrate.

20. The method of claim 19 comprising removing the non-exposed regions in the negative-working infrared radiation-sensitive image-recording layer from the aluminum-containing substrate on-press using a lithographic printing ink, a fountain solution, or a combination of a lithographic printing ink and a fountain solution.

* * * * *